United States Patent [19]

Yokoya

[11] Patent Number: 4,525,686
[45] Date of Patent: Jun. 25, 1985

[54] PHASE-LOCKED LOOP CIRCUIT WITH VARIABLE BANDWIDTH FILTER

[75] Inventor: Satoshi Yokoya, Chofu, Japan

[73] Assignee: Sony Corporation, Tokyo, Japan

[21] Appl. No.: 368,106

[22] Filed: Apr. 14, 1982

[30] Foreign Application Priority Data

Apr. 15, 1981 [JP] Japan .................................. 56-56796

[51] Int. Cl.³ .............................................. H03L 7/08
[52] U.S. Cl. ........................................ 331/17; 331/25;
331/DIG. 2; 329/50; 329/122; 329/124;
381/15
[58] Field of Search ......................... 329/50, 122, 124;
331/17, 25, DIG. 2; 381/2, 15; 455/260

[56] References Cited

U.S. PATENT DOCUMENTS

| | | | |
|---|---|---|---|
| 3,958,186 | 5/1976 | Jesse et al. .......................... | 331/25 X |
| 4,007,429 | 2/1977 | Cadalora et al. .......... | 331/DIG. 2 X |
| 4,115,745 | 9/1978 | Egan ....................................... | 331/17 |
| 4,135,165 | 1/1979 | Coe ........................... | 331/DIG. 2 X |
| 4,167,711 | 9/1979 | Smoot .................................... | 331/17 |
| 4,205,277 | 5/1980 | Poinas ................................ | 331/25 X |
| 4,374,335 | 2/1983 | Fukahori et al. ................. | 331/25 X |

Primary Examiner—Eugene R. LaRoche
Assistant Examiner—W. R. Paxman
Attorney, Agent, or Firm—Lewis H. Eslinger; Alvin Sinderbrand

[57] ABSTRACT

A phase-locked loop circuit comprises an oscillator, a phase comparator which compares the phase of an input signal with the phase of an oscillator signal, a detector which detects when the phase-locked loop circuit is locked within a predetermined frequency range and produces a corresponding lock detecting signal, and a filter circuit including a variable current source which produces a variable current in response to a change of state of the lock detecting signal to control the bandwidth of the filter circuit, a filter element which receives the variable current, a differential amplifier which receives the phase-compared signal, a current mirror circuit which receives the variable current from the variable current source, and a buffer circuit connected to the filter element which supplies an output signal to the oscillator to lock the frequency of the oscillator signal to the frequency of the input signal.

10 Claims, 7 Drawing Figures

PHASE-LOCKED LOOP CIRCUIT WITH VARIABLE BANDWIDTH FILTER

BACKGROUND OF THE INVENTION

1. Field of the Invention

This invention relates generally to phase-locked loop circuits and, more particularly, is directed to a phase-locked loop circuit for use with a demodulating circuit of an AM stereophonic receiver.

2. Description of the Prior Art

Systems for transmitting and receiving AM stereo signals are known in the art. In such systems, a phase-locked loop (PLL) circuit is provided in the stereo demodulating circuit of the AM stereophonic receiver to produce a pure carrier or non-modulation component of the received input signal by attenuating a side band component of the input signal. Accordingly, the response frequency of the PLL circuit is generally set in a lower frequency range of the modulation frequency of the signal, for example, in the range of 20-50 Hz. Accordingly, because of this so-called capture range of the PLL circuit, or when the frequency of the received input signal is changed from the condition where the PLL circuit is not locked, the variable range of the oscillating frequency produced by a voltage-controlled oscillator(VCO) in the PLL circuit which can be locked to such input signal becomes extremely narrow. As a result, manual tuning for the AM stereophonic signal becomes quite difficult and the locked state of the circuit may become lost by changes in temperature, vibration and the like.

Accordingly, it has been proposed to provide a lock detecting circuit which produces a lock detected output signal when the PLL circuit is in its locked state. This lock detected output signal is used to switch the PLL circuit such that the latter has a large capture range of, for example, 5-10 KHz when the locked condition of the PLL circuit is lost and has a narrow capture range within a predetermined frequency band, as aforementioned, when the locked condition of the PLL circuit is operative. In particular, the lock detected output signal is supplied through a switch and a low-pass filter to the VCO to vary the oscillating frequency generated thereby. The switch is changed over to different resistances in accordance with the switching state to control the VCO during the locked and unlocked (released) states. The ratio of the resistances associated with the different contacts of the switch is approximately 500:1, which varies the response frequency of the PLL circuit from the range of 20 Hz-10 KHz to the range of 20-50 Hz. Accordingly, it should be appreciated that the loop gain of the PLL circuit must be changed over a wide range which requires strict adherence to the resistance values of the switch and control of any leakage resistance at the switch. In addition, if the switch has a serial offset, the locked state of the PLL circuit may sometimes be released during the switching operation if the switch timing is unsatisfactory. For this reason, it is extremely difficult to construct an analog switch as a bipolar linear IC (integrated circuit). Accordingly, to avoid this problem, MOSFETs and the like must be provided at the output of the integrated circuit, making manufacture of the PLL circuit expensive.

OBJECTS AND SUMMARY OF THE INVENTION

Accordingly, it is an object of this invention to provide a PLL circuit for an AM stereophonic receiver that avoids the above-described difficulties encountered with the prior art.

In particular, it is an object of this invention to provide a PLL circuit for an AM stereophonic receiver which can be formed as a bipolar linear integrated circuit.

It is another object of this invention to provide a PLL circuit for an AM stereophonic receiver in which the loop gain thereof can easily and smoothly be varied over a wide frequency range.

It is yet another object of this invention to provide a PLL circuit for an AM sterophonic receiver which can be produced at a low cost.

In accordance with an aspect of this invention, a phase-locked loop circuit includes oscillator means for producing an oscillation signal; phase comparator means for phase-comparing an input signal with the oscillation signal to produce a phase-compared signal; detecting means for detecting when the phase-locked loop circuit is locked within a predetermined frequency range and for producing a lock detecting signal corresponding to the detection in response to the input signal and the oscillation signal; and filter means for producing an output signal in response to the phase-compared signal and the lock detecting signal to lock the frequency of the oscillation signal to the frequency of the input signal, the filter means including variable current source means for producing a variable current in response to the lock detecting signal; a filter circuit, and control means connected to the filter circuit for producing the output signal in response to the variable current and the phase-compared signal.

The above, and other, objects, features and advantages of the present invention will become apparent from the following detailed description of illustrative embodiments of the invention which is to be read in connection with the accompanying drawings.

DETAILED DESCRIPTION OF THE PREFERRED EMBODIMENTS

Figure 1:
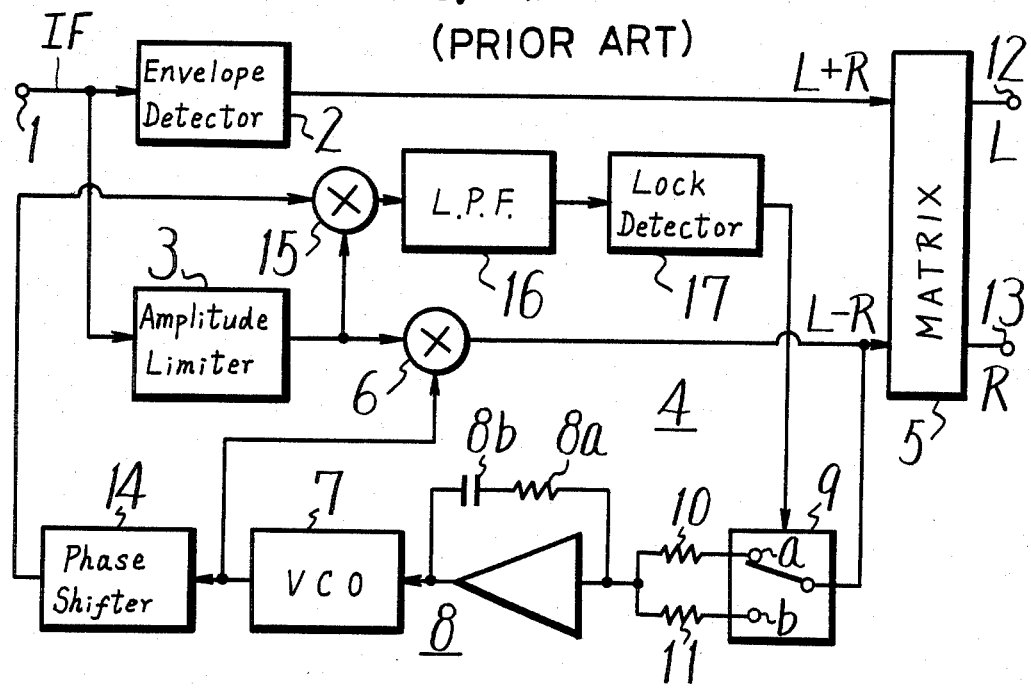
FIG. 1 is a block diagram of an AM stereophonic receiver according to the prior art.
Figure 3:
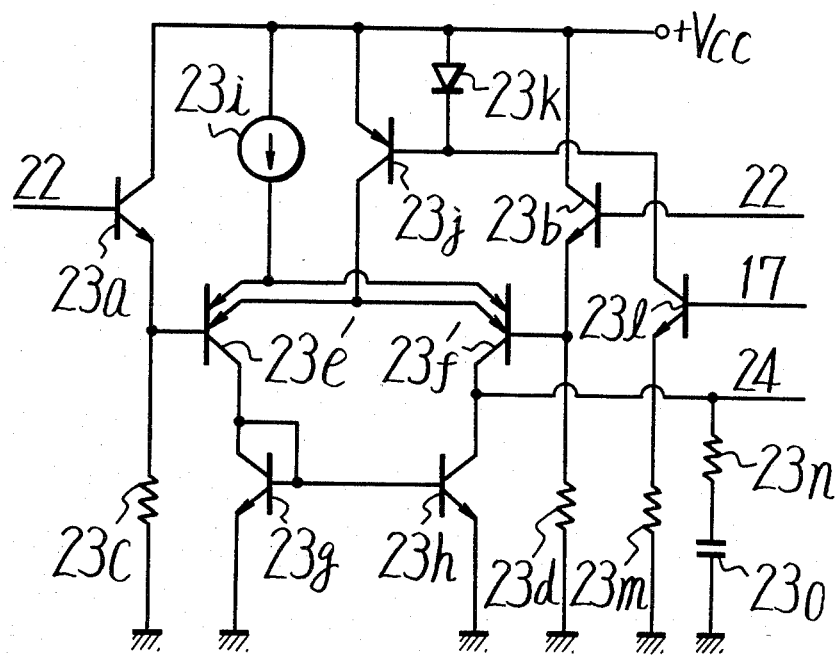
FIG. 3 is a circuit-wiring diagram of a PLL circuit for an AM stereophonic receiver according to another embodiment of this invention.

Referring to the drawings in detail, and initially to FIG. 1 thereof, a PLL circuit for a prior art stereo demodulating circuit of an AM (amplitude-modulation) stereophonic receiver includes an input terminal 1 supplied with an intermediate frequency (IF) signal from an intermediate frequency (IF) stage (not shown) of the AM stereophonic receiver. The intermediate frequency signal from input terminal 1 is supplied to an envelope detector 2 which envelope detects the signal to produce a sum signal (L+R) corresponding to the sum of left (L) and right (R) channel stereophonic signals. The intermediate frequency signal is also supplied to an amplitude limiter 3 which removes the AM-modulation component from the IF signal, and the output from amplitude limiter 3 is phase detected or multiplied by the output signal from a phase-locked loop (PLL) circuit 4 to produce a difference signal (L−R) corresponding to the difference of the left (L) and right (R) channel stereophonic signals. The sum signal (L−R) and the difference signal (L−R) are supplied to respective inputs of a matrix circuit 5 which mixes the signals to produce a main or left (L) channel stereophonic signal and a sub-channel or right (R) channel stereophonic signal at output terminals 12 and 13, respectively.

PLL circuit 4 includes a multiplier 6 for phase comparing the output signal from amplitude limiter 3 by the output signal from PLL circuit 4 to produce the aforementioned difference signal (L−R). This difference signal is supplied through a switch circuit 9 and a low-pass filter 8 to a voltage-controlled oscillator (VCO) 7 which supplies a non-modulation signal, which deviates in phase from the IF signal by 90°, to an input of multiplier 6. In this manner, multiplier 6 phase locks the output signal from amplitude limiter 3 with a phase difference of 90° to produce the aforementioned difference signal (L−R). In PLL circuit 4, the movable arm of switch circuit 9 is switched to either a fixed contact a or a fixed contact b to supply the difference signal to low-pass filter 8. In particular, a first resistor 10 is connected between contact a and low-pass filter 8 and a second resistor 11 is connected between contact b and low-pass filter 8, with the resistance ratio between resistors 10 and 11 being set at approximately 500:1 to achieve a loop response frequency switchable in the range from 20 Hz to 10 KHz. The difference signal supplied through switch circuit 9 and either resistor 10 or resistor 11 is supplied to low-pass filter 8 which is comprised of an active low-pass filter arrangement and includes an amplifier supplied with the signal through resistor 10 or resistor 11, and a series circuit of a resistor 8a and a capacitor 8b connected between the input and output of the amplifier.

The output signal from VC0 7, which has its phase deviated from the IF signal by 90°, is supplied to a phase shifter 14 which shifts the phase of the output signal from VCO by 90° to thereby produce a signal which is in phase with the IF signal and which is supplied to one input of a multiplier 15. The other input of multiplier 15 is supplied with the output signal from amplitude limiter 3, and accordingly, multiplier 15 phase compares the output signal from amplitude limiter 3 with the signal from phase shifter 14 to produce a compared output signal which is supplied to a low-pass filter 16. This latter circuit produces a DC signal when PLL circuit 4 is in its locked state and does not produce such DC signal when the locked state of PLL circuit 4 is released. The output DC signal from low-pass filter 16 is supplied to a lock detecting circuit 17 which controls switch circuit 9 so that the movable arm thereof is in contact with fixed contact a when PLL circuit 4 is in its locked state. At this time, the difference signal is supplied through switch circuit 9 and resistor 10 to low-pass filter 8. Because of the resistance value of resistor 10, the capture range of PLL circuit 4 is narrowed to a predetermined frequency band, for example, 20 Hz–50 Hz. On the other hand, when PLL circuit 4 is not in its locked state, that is, when no DC signal is supplied to lock detecting circuit 17 from low-pass filter 16, lock detecting circuit 17 controls switch circuit 9 so that the movable arm thereof contacts fixed contact b and thereby replaces resistor 10 with resistor 11. Since resistor 11 has a resistance value lower than that of resistor 10, as previously described, the capture range of PLL circuit 4 is increased or widened.

In the circuit of FIG. 1, if the level of the difference signal supplied to switch circuit 9 is given as $V_i$ and the resultant signal from low-pass filter 8 is given as $V_O$, the transfer function F(S) of low-pass filter 8 can be expressed as follows:

$$F(S) = \frac{V_O}{V_i} = \frac{R_1 + \frac{1}{CS}}{R_2}, \quad (1)$$

where $R_1$ is the value of the resistance of resistor 8a, $R_2$ is the value of the resistance of either resistor 10 or 11, C is the value of the capacitance of capaciter 8b and S is a complex frequency. It is to be appreciated from equation (1) that, if the value of $R_2$ is changed, that is, depending upon whether switch circuit 9 is switched in series with resistor 10 or resistor 11, the transfer function F(S) of low-pass filter 8 changes, and accordingly, the frequency band thereof is changed in response to whether PLL circuit 4 is in its locked or unlocked state. However, as previously discussed, the ratio of the resistance values of resistors 10 and 11 is set at approximately 500:1 to achieve a loop response frequency which is switchable in the range of 20 Hz to 10 KHz.

Since the AM stereophonic receiver of FIG. 1 must therefore vary the loop gain of PLL circuit 4 over a wide range, this requires strict adherence to the resistance values at switch circuit 9 and control of any leakage resistance at the switch circuit. In addition, if the switch circuit has a serial offset, the locked state of PLL circuit 4 may sometimes be released during the switching operation if the switch timing is unsatisfactory. For this reason, it is extremely difficult to construct an analog switch as a bipolar linear integrated circuit in the circuit of FIG. 1. To avoid this problem, MOSFETs and the like must be provided at the output of the integrated circuit, making manufacture of PLL circuit 4 expensive.

Figure 2:
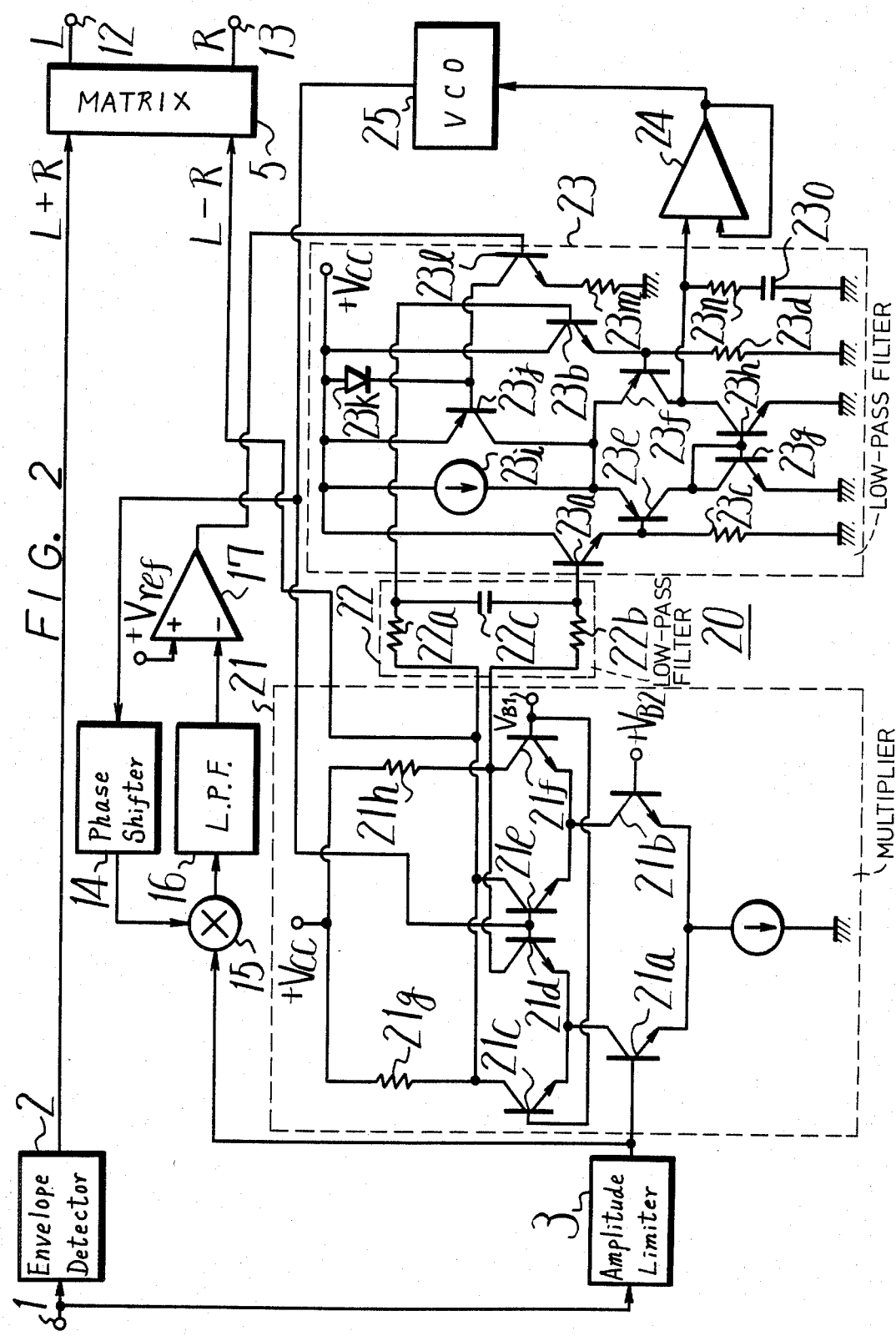
FIG. 2 is a circuit-wiring, block diagram of an AM stereophonic receiver according to one embodiment of this invention.

Referring now to FIG. 2, an AM stereo receiver according to one embodiment of this is shown, in which elements corresponding to those described above with reference to the prior art circuit of FIG. 1 are identified by the same reference numerals and a detailed description thereof will be omitted herein for the sake of brevity. In particular, the IF signal from an IF stage (not shown) is supplied to envelope detector 2 which envelope detects the signal to produce the sum signal (L+R) which is supplied to one input of matrix circuit 5. The IF signal is also supplied to an amplitude limiter 3 which removes the AM-modulation component from the IF signal. The output signal from amplitude limiter 3 is supplied to a PLL circuit 20 according to this invention and, in particular, to a multiplier 21 of the double-balanced type for phase comparison with the output signal from a voltage-controlled oscillator 25. More particularly, the output signal from amplitude limiter 3 is supplied to the base of an NPN transistor 21a which forms a first differential amplifier with another NPN transistor 21b. The emitters of transistors 21a and 21b are commonly-connected to a current source and the base of transistor 21b is connected to a reference voltage supply source $+V_{B2}$. The collector of transistor 21a is connected to the commonly-connected emitters of two NPN transistors 21c and 21d which form a second differential amplifier, and the collector of transistor 21b is connected to the commonly-connected of two NPN transistors 21e and 21f which form a third differential amplifier. The output signal from VCO 25 is supplied to the commonly-connected bases of transistors 21d and 21e of the respective second and third differential amplifiers and the bases of transistors 21c and 21f are commonly connected together. The collectors of transistors 21c and 21e are commonly-connected to a voltage source $+V_{CC}$ through a load resistor 21g and the collectors of transistors 21d and 21f are commonly-connected to voltage source $+V_{CC}$ through a load resistor 21h. In this manner, current proportional to the phase difference between the output signals from amplitude limiter 3 and VCO 25 flows through load resistors 21g and 21h to produce a phase error voltage signal. In addition, it is to be noted that the output signal at the commonly-connected collectors of transistors 21c and 21e constitutes the difference signal (L−R) which is supplied to matrix circuit 5 which, as previously discussed, produces left (L) and right (R) channel stereophonic signals at output terminals 12 and 13, respectively.

The phase error voltage signal at the collectors of transistors 21c-21f is supplied to a low-pass filter 22 comprised of resistors 22a and 22b and a capacitor 22c, and which eliminates a carrier component from the phase error voltage signal. In particular, the output signal at the commonly-connected collectors of transistors 21c and 21e is supplied to one end of resistor 22a and the output signal at the commonly-connected collectors of transistors 21d and 21f is supplied to one end of resistor 22b. The other ends of resistors 22a and 22b are connected together by capacitor 22c, and these latter ends of resistors 22a and 22b constitute the output of low-pass filter 22 and are connected to the bases of two NPN buffer transistors 23b and 23a, respectively, of an emitter-follower configuration, in a second low-pass filter 23, which is provided to switchably change the frequency band of the PLL circuit. The collectors of transistors 23a and 23b are commonly-connected to a positive voltage supply source $+V_{CC}$ and the emitters thereof are grounded through resistors 23c and 23d, respectively. The emitters of transistors 23a and 23b are also connected to the bases of two PNP transistors 23e and 23f, respectively, which form a differential amplifier. The collectors of transistors 23e and 23f are each connected to ground through the collector-emitter paths of two NPN transistors 23g and 23h, respectively, which form a current mirror circuit. In addition, the bases of transistors 23g and 23h are commonly-connected to the collector of transistor 23g.

The emitters of transistors 23e and 23f of the differential amplifier are commonly-connected to a positive voltage supply source $+V_{CC}$ through a first path comprised of a constant current source 23i and a second path comprised of the collector-emitter path of a PNP transistor 23j. The base of transistor 23j is also connected to positive voltage supply source $+V_{CC}$ through a diode 23k and is also connected to the collector of an NPN transistor 23l, the emitter of this latter transistor being connected to ground through a resistor 23m and the base thereof being supplied with the lock detected output signal from lock detecting circuit 17. In addition, the collector of transistor 23f, which is connected to the collector of transistor 23h, is connected to ground through a low-pass filter circuit formed of a resistor 23n and a capacitor 23o which serves as a load for transistors 23e and 23f, and is also connected to an input of a buffer circuit 24 which does not form part of low-pass filter 23. The output signal from buffer circuit 24 is supplied to VCO 25 to control the oscillation frequency thereof, that is, to lock the oscillation frequency to the frequency of the output signal from amplitude limiter 3.

The remainder of the circuit of FIG. 2 is substantially identical to that of FIG. 1. In particular, the output signal from VCO 25 of PLL circuit 20 is supplied to phase shifter 14 which shifts the phase of the output signal from VCO 25 by 90° to thereby produce a signal which is in phase with the IF signal. The output signal from phase shifter 14 is supplied to one input of multiplier 15 along with the output signal from amplitude limiter 3, whereby multiplier 15 phase compares the output signal from amplitude limiter 3 with the signal from phase shifter 14 to produce a compared output signal which is supplied to low-pass filter 16. The output signal from low-pass filter 16 is supplied to a lock-detecting circuit 17 which, as shown in FIG. 2, may include an operational amplifier supplied with the output signal from low-pass filter 16 at its inverting input and with a reference voltage $+V_{ref}$ at its non-inverting input. The output signal from lock detecting circuit 17, as aforementioned, is supplied to the base of transistor 23l of low-pass filter 23.

When PLL circuit 20 is in its locked state, lock detecting circuit 17 produces a negative signal which is supplied to the base of transistor 23l to turn this transistor OFF. Accordingly, transistor 23j is also rendered inoperative. In this manner, a constant current flows from constant current source 23i through transistors 23e and 23f. On the other hand, when PLL circuit 20 is in its unlocked state, lock detecting circuit 17 supplies a positive signal to transistor 23l to turn this transistor ON, and thereby also turn transistor 23j ON. In this manner, current flows from transistor 23j to transistors 23e and 23f, along with the current from constant current source 23i. In other words, current source 23i and transistors 23j and 23l effectively constitute a variable current source. It is to be appreciated that the current from transistor 23j is determined by resistor 23m which is connected between the emitter of transistor 23l and ground.

The transfer function F(S) of low-pass filter 23 can be approximately expresed by the following equation:

$$F(S) = \frac{V_O}{V_i} = \frac{R + \frac{1}{CS}}{re}, \qquad (2)$$

where $V_i$ is the level of the input signal thereto, $V_O$ is the level of the output signal therefrom, R is the value of the resistance of resistor 23n, C is the value of the capacitance of capacitor 23o and re is the emitter resistances of transistors 23e and 23f. It is to be noted that the emitter resistance re=0.0026/ie, where ie is the emitter current. Accordingly, if the current flowing through transistors 23e and 23f is varied in accordance with the locked or unlocked (released) state of PLL circuit 20, the emitter resistance re of transistors 23e and 23f is also varied. In this manner, a similar operation can be achieved as with the switching operation of resistors 10 and 11 in the circuit of FIG. 1. For example, the current $i_o$ from constant current source 23i can be set at 1 μA and the current flowing through transistor 23j when the latter is turned ON can be set at 500 μA. In this manner, when PLL circuit 20 is in its locked state, the current flowing through the emitters of transistors 23e and 23f is equal to 1 λA from constant current source 23i. On the other hand, during the unlocked or released state of PLL circuit 20, the current supplied to the emitters of transistors 23e and 23f is approximately equal to 500 μA. It should be appreciated from the above emitter resistance-emitter current relation that each of the emitter resistances re of transistors 23e and 23f can be changed from 2.6KΩ during the locked state of PLL circuit 20 to 5.2Ω during the unlocked state of PLL circuit 20, whereby to provide a 500:1 emitter resistance ratio between the locked and unlocked states of PLL circuit 20. By changing the values of the emitter resistances re of transistors 23e and 23f, the gain of low-pass filter 23 is likewise varied. In particular, when PLL circuit 20 is in its locked state, the gain of low pass filter 23 is small to thereby narrow the capture range of PLL circuit 20. On the other hand, when PLL circuit 20 is in its unlocked state, the gain of low-pass filter 23 is large, whereby to widen the capture range of PLL circuit 20.

It is to be appreciated that the present invention provides distinct advantages over the prior art circuit of FIG. 1. In particular, since the output signal from lock detecting circuit 17 changes continuously between the locked and unlocked states of PLL circuit 20, the currents flowing through transistors 23l and 23j change in sequence. Thus, unlike switch circuit 9 in PLL circuit 4 of FIG. 1, which is suddenly switched between two contacts a and b, there is no shock or sudden switching operation with PLL circuit 20. In addition, since transistors 23e and 23f are always supplied with the constant current from constant current source 23i, there is no sudden switching operation of these transistors. In this manner, constant current source 23i prevents sudden changes in current from being transmitted to buffer circuit 24 so that the phase locked condition of PLL circuit 20 is not lost by any switching operation. In other words, the current supplied through the circuit will never be completely cut off even if there is a slight DC offset. Also, the gain of low-pass filter 23 is smoothly switched so that the operation thereof is easily performed during a tuning operation.

Referring now to FIGS. 3–7, it will be seen that, in other embodiments of low-pass filter 23 in PLL circuit 20 according to this invention, elements corresponding to those described above with respect to low-pass filter 23 of FIG. 2 are identified by the same reference numerals and a detailed description thereof will be omitted herein for the sake of brevity. In any event, the basic operation is the same with all of the following circuits. In particular, in the low-pass filter of FIG. 3, transistors 23e' and 23f' having multi-emitters are substituted for transistors 23e and 23f, respectively, and the different emitters of transistors 23e' and 23f' have different areas. In this manner, the emitters of these transistors which have large areas are commonly-connected to the collector of transistor 23j to be supplied with a large current, while the emitters having small areas are commonly-connected to constant current source 23i to be supplied with a small current. In this manner, transistors 23e' and 23f' can be operated in a linear range, while still achieving the aforementioned advantages obtained with the circuit of FIG. 2.

Figure 4:
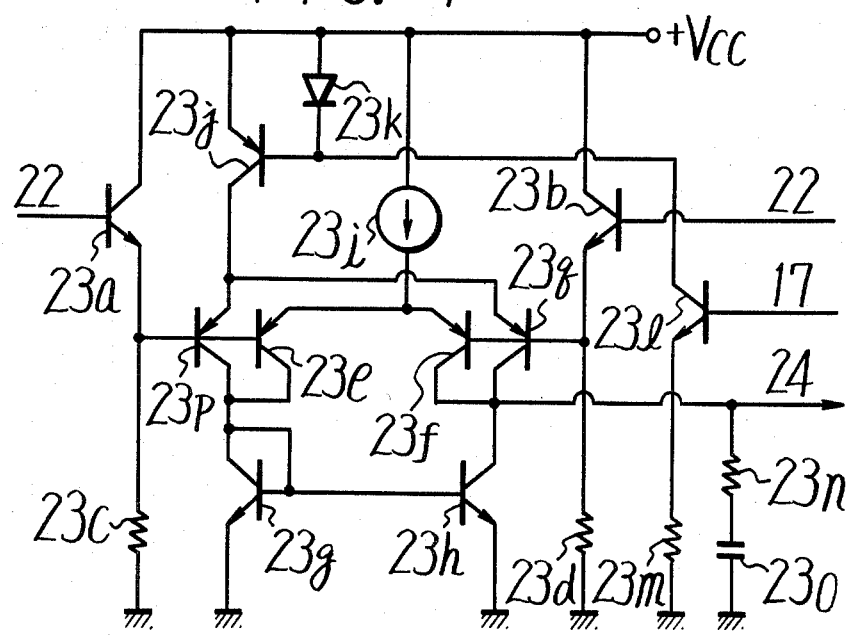
FIG. 4 is a circuit-wiring diagram of a PLL circuit for an AM stereophonic receiver according to another embodiment of this invention.

Referring now to FIG. 4, it will be seen that, in a low-pass filter 23 for a PLL circuit 20 according to another embodiment of this invention, elements corresponding to those described above with reference to the circuit of FIG. 2 are identified by the same reference numerals and a detailed description thereof will be omitted herein for the sake of brevity. In particular, two PNP transistors 23p and 23q are effectively connected in parallel with transistors 23e and 23f, respectively. Thus, the bases and collectors of transistors 23e and 23p are commonly-connected together, and the bases and collectors of transistors 23f and 23q are also commonly connected together. The emitters of transistors 23e and 23f are commonly-connected to constant current source 23i, and the emitters of transistors 23p and 23q are commonly-connected to the collector of transistor 23j. In this manner, a large current can be used with PLL circuit 20 in a similar manner as with low-pass filter 23 of FIG. 3.

Figure 5:
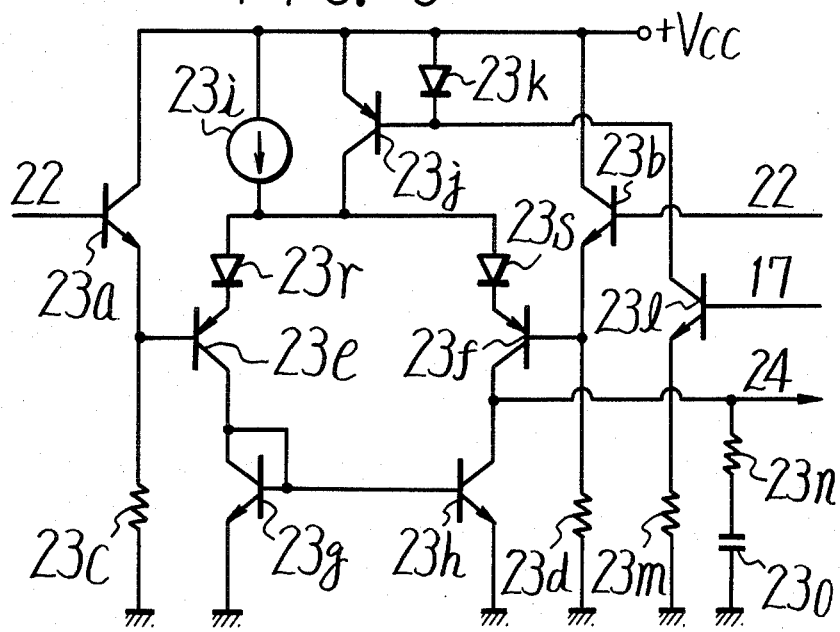
FIG. 5 is a circuit-wiring diagram of a PLL circuit for an AM stereophonic receiver according to another embodiment of this invention.

In the low-pass filter of FIG. 5 according to this invention, elements corresponding to those described above with reference to the circuit of FIG. 2 are identified by the same reference numerals and a detailed description thereof will be omitted herein for the sake of brevity. In the low-pass filter of FIG. 5, diodes 23r and 23s are connected between the emitters of transistors 23e and 23f, respectively, and the common connecting point between constant current source 23i and the collector of transistor 23j. With this arrangement, linearity of the circuit is improved in response to the level of the input signal, thereby providing an increased dynamic range.

Figure 6:
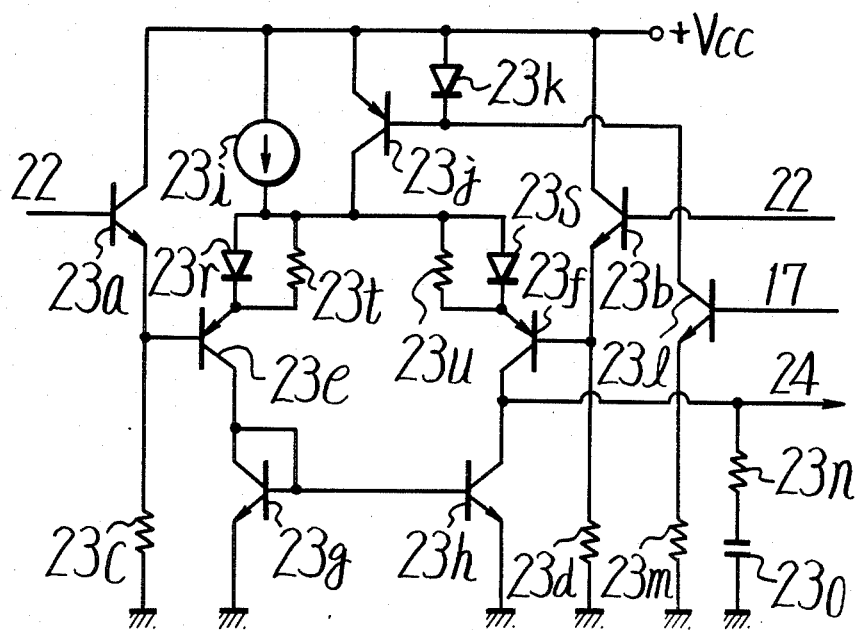
FIG. 6 is a circuit-wiring diagram of a PLL circuit for an AM stereophonic receiver according to another embodiment of this invention.

Referring now to FIG. 6, it will be seen that, in another embodiment of low-pass filter 23 of PLL circuit 20 according to this invention, elements corresponding to those described above with reference to the circuit of FIG. 5 are identified by the same reference numerals and a detailed description thereof will be omitted herein for the sake of brevity. In particular, resistors 23t and 23u are connected in parallel with diodes 23r and 23s, respectively. This means that a fixed resistance is substantially added to the emitter resistances re of transistors 23e and 23f. In this manner, the variable range of current is narrowed to achieve a large change in the emitter resistances and thereby increase the dynamic range of the circuit.

Figure 7:
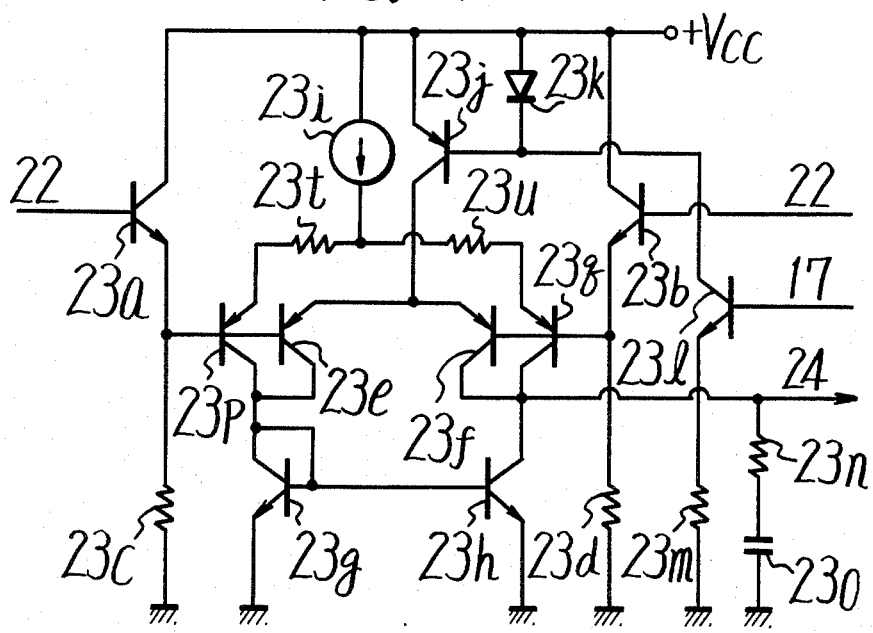
FIG. 7 is a circuit-wiring diagram of a PLL circuit for an AM stereophonic receiver according to another embodiment of this invention.

Referring now to FIG. 7, it will be seen that, in another embodiment of a low-pass filter 23 of PLL circuit 20 according to this invention, elements corresponding to those described above with reference to the circuit of FIG. 4 are identified by the same reference numerals and a detailed description thereof will be omitted herein for the sake of brevity. In the circuit of FIG. 7, resistors 23t and 23u are connected between the emitters of transistors 23p and 23q, respectively, and constant current source 23i. The collector of transistor 23j is connected to the common connection point of transistors 23e and 23f. It is to be appreciated that various modifications can be made with the circuit of FIG. 7. For example, the common connection point between the respective emitters of transistors 23e and 23f and the common connection point between the respective emitters of transistors 23p and 23q may be arranged as shown in FIG. 4. In addition, resistors 23t and 23u may be inserted into the emitter legs of transistors 23e and 23f, respectively, or between the common connection point of constant current source 23i to one pair of transistors and the common connection point of the collector of transistor 23j to the other pair of transistors. In any event, with the arrangement of FIG. 7, even if the change in current is not large, a relatively large change in resistance can be achieved, as with the circuit shown in FIG. 6.

As described above, and in accordance with the present invention, since a bias current source for the differential amplifier having a low-pass characteristic, achieved by the output capacitor, resistor and the like as a load therefor, is controlled by the phase lock detecting signal to vary the response speed of the PLL circuit, PLL circuit 20 according to this invention can be constructed as a linear bipolar integrated circuit. As a result, there is no requirement to use expensive MOSFETs, as with conventional PLL circuits. In this manner, the PLL circuit according to this invention can be produced at a low cost.

In addition, since the present invention utilizes changes in the emitter resistances of the transistors comprising the differential amplifier of low-pass filter 23, the frequency band of PLL circuit 20 is smoothly switched. This means that the switching operation is not influenced by any DC offset, such that the locked state of the PLL circuit will never be lost during the switching operation. Further, with the present invention, the gain of PLL circuit 20 can easily and smoothly be varied over a wider range so the operation of the AM stereophonic receiver can be enhanced during a tuning operation. In addition, while the above embodiments of the PLL circuit according to this invention have been shown in regard to a demodulating circuit for an AM stereophonic receiver, the PLL circuit according to this invention is not limited to such use.

Having described specific preferred embodiments of the invention with reference to the accompanying drawings, it is to be understood that the present invention is not limited to those specific embodiments, and that various changes and modifications may be effected therein by one skilled in the art without departing from the scope or spirit of the invention as defined in the claims.

What is claimed is:

1. A phase-locked loop circuit comprising:
  oscillator means for producing an oscillation signal;
  phase comparator means for phase-comparing an input signal with said oscillation signal to produce a phase-compared signal;
  detecting means for detecting when said phase-locked loop circuit is locked within a predetermined frequency range and for producing a lock detecting signal corresponding to said detection in response to said input signal and said oscillation signal; and
  filter means for producing an output signal in response to said phase-compared signal and said lock detecting signal to lock the frequency of said oscillation signal to the frequency of said input signal, said filter means including variable current source means for producing a variable current having a first value in the presence of and a second value in the absence of said lock detecting signal, a filter circuit supplying said output signal, and control means connected to said filter circuit for producing said output signal in response to said variable current and said phase-compared signal, said control means including a differential amplifier comprised of first and second transistors, each having a base, collector and emitter terminal, said filter circuit being connected to the collector terminal of one of said transistors, said variable current being supplied to the emitter terminals of said transistors, and said phase-compared signal being supplied to the base terminals of said transistors.

2. A phase-locked loop circuit according to claim 1; in which said filter circuit includes a resistive element and a capacitive element connected in series between the collector terminal of said one of said transistors and a reference potential.

3. A phase-locked loop circuit according to claim 1; in which said control means includes current mirror means connected to the collector terminals of said first and second transistors.

4. A phase-locked loop circuit according to claim 1; in which the emitter terminals of said first and second transistors are multi-emitter terminals.

5. A phase-locked loop circuit according to claim 4; in which said variable current source means includes a first constant current source which supplies a constant current to said control means and a second current source which supplies a second current to said control means only when the phase-locked loop circuit is not locked within said predetermined frequency range; and said multi-emitter terminals include first emitter terminals having first areas and connected to said first constant current source and second emitter terminals having second, larger areas and connected to said second current source.

6. A phase-locked loop circuit according to claim 1; in which said control means includes non-linear means connected between the emitter terminals of said transistors and said variable current source means.

7. A phase-locked loop circuit according to claim 6; in which said control means includes resistive means connected in parallel with said non-linear means.

8. A phase-locked loop circuit comprising:
  oscillator means for producing an oscillation signal;
  phase comparator means for phase-comparing an input signal with said oscillation signal to produce a phase-compared signal;
  detecting means for detecting when said phase-locked loop circuit is locked within a predetermined frequency range and for producing a lock detecting signal corresponding to said detection in response to said input signal and said oscillation signal; and
  filter means for producing an output signal in response to said phase-compared signal and said lock detecting signal to lock the frequency of said oscillation signal to the frequency of said input signal, said filter means including variable current source means for producing a variable current having a first value in the presence of and a second value in the absence of said lock detecting signal, a filter circuit supplying said output signal, and control means connected to said filter circuit for producing said output signal in response to said variable current and said phase-compared signal, said control means including a first transistor pair comprising first and second transistors and a second transistor pair comprising third and fourth transistors, each of said transistors having a base, emitter and collector terminal, the base terminals of said first and second transistors being connected in common, the base terminals of said third and fourth transistors being connected in common, the collector terminals of said first and second transistors being connected in common, the collector terminals of said third and fourth transistors being connected in common, and the emitter terminals of said first through fourth transistors being connected to said variable current source means.

9. A phase-locked loop circuit according to claim 8; in which said variable current source means includes a first constant current source and a second current source; and the emitter terminals of said first and third transistors are connected to said first constant current source and the emitter terminals of said second and fourth transistors are connected to said second current source.

10. A phase-locked loop circuit according to claim 9; in which said control means includes resistive means connected between the emitter terminals of said first and third transistors and said first constant current source.

* * * * *